United States Patent
Li et al.

(10) Patent No.: US 12,507,442 B2
(45) Date of Patent: Dec. 23, 2025

(54) THIN FILM TRANSISTOR SUBSTRATE AND ELECTRONIC DEVICE

(71) Applicant: Wuhan China Star Optoelectronics Technology Co., Ltd., Hubei (CN)

(72) Inventors: Zhifu Li, Hubei (CN); Guanghui Liu, Hubei (CN); Fei Ai, Hubei (CN); Dewei Song, Hubei (CN); Zhuang Li, Hubei (CN)

(73) Assignee: Wuhan China Star Optoelectronics Technology Co., Ltd., Wuhan (CN)

( * ) Notice: Subject to any disclaimer, the term of this patent is extended or adjusted under 35 U.S.C. 154(b) by 449 days.

(21) Appl. No.: 18/086,890

(22) Filed: Dec. 22, 2022

(65) Prior Publication Data
US 2024/0194792 A1 Jun. 13, 2024

(30) Foreign Application Priority Data
Dec. 8, 2022 (CN) .......................... 202211574828.9

(51) Int. Cl.
*H01L 29/786* (2006.01)
*H01L 29/417* (2006.01)
*H10D 30/67* (2025.01)

(52) U.S. Cl.
CPC ..... *H10D 30/6757* (2025.01); *H10D 30/6729* (2025.01)

(58) Field of Classification Search
CPC ........... H10D 30/6757; H10D 30/6729; H10D 30/6728; H10D 30/6723

USPC .......................................................... 257/288
See application file for complete search history.

(56) References Cited

U.S. PATENT DOCUMENTS

| 6,207,481 B1 | 3/2001 | Yi et al. | |
| 2024/0038895 A1* | 2/2024 | Li | H10D 30/6728 |
| 2024/0047582 A1* | 2/2024 | Choi | H10D 30/6729 |

FOREIGN PATENT DOCUMENTS

| CN | 102339859 | 2/2012 |
| CN | 115188829 | 10/2022 |

OTHER PUBLICATIONS

Notification of Office Action and Search Report Dated Oct. 18, 2024 From the State Intellectual Property Office of the People's Republic of China Re. Application No. 202211574828.9 and Its Translation Into English. (20 Pages).

* cited by examiner

*Primary Examiner* — Tong-Ho Kim

(57) ABSTRACT

The present application provides a thin film transistor substrate and an electronic device. The thin film transistor substrate includes: a substrate; a boss including an undercut structure, the undercut structure is located on a side wall of the boss; a filler located in the undercut structure; and an active layer located on the boss and the substrate, the active layer includes a channel, and the channel covers the undercut structure and the filler.

17 Claims, 8 Drawing Sheets

THIN FILM TRANSISTOR SUBSTRATE AND ELECTRONIC DEVICE

TECHNICAL FIELD

The present application relates to the technical field of display, in particular to a thin film transistor substrate and an electronic device.

BACKGROUND

Integrating integrated circuits on a glass substrate (SOG) can greatly improve integration of a display panel and reduce manufacturing cost of the display panel. However, it is necessary to improve integration of thin film transistors on the substrate, maximum operating frequency and circuit density of the thin film transistors to achieve the SOG, therefore, a shorter channel length, a smaller volume, and higher mobility of the thin film transistors are needed to achieve the above-mentioned items.

SUMMARY

To solve the above-mentioned problems, technical solutions provided by the present application are as following.

The present application provides a thin film transistor substrate and an electronic device. The thin film transistor substrate includes:
 a substrate;
 a boss located on the substrate, wherein the boss includes an undercut structure, the undercut structure is located on a side wall of the boss;
 a filler located in the undercut structure; and
 an active layer located on the boss and the substrate, wherein the active layer includes a channel, the channel covers the undercut structure and the filler.

Optionally, in some embodiments of the present application, the undercut structure is located on a side of the boss close to the substrate.

Optionally, in some embodiments of the present application, the channel is a single-crystal structure, a length of the channel is greater than or equal to 0.01 μm and less than or equal to 1 μm, and a thickness of the boss is greater than or equal to 800 Å and less than or equal to 3000 Å.

Optionally, in some embodiments of the present application, the boss includes a first film layer and a second film layer, and the first film layer and the second film layer are stacked on the substrate in sequence;
 at a junction of the first film layer and the second film layer, the first film layer is partially indented inward to define the undercut structure.

Optionally, in some embodiments of the present application, the undercut structure is defined by a bottom surface of the second film layer and a side wall of the first film layer, and the bottom surface is a surface of the second film layer contacting the first film layer.

Optionally, in some embodiments of the present application, a distance between an edge of the bottom surface and the side wall of the first film layer is greater than or equal to 0.3 μm and less than or equal to 1 μm.

Optionally, in some embodiments of the present application, an included angle between a top surface of the second film layer and a side wall of the second film layer is greater than 90°.

Optionally, in some embodiments of the present application, the channel covers at least a part of a side wall of the second film layer.

Optionally, in some embodiments of the present application, a ratio of a thickness of the second film layer to a thickness of the first film layer is greater than or equal to 2 and less than or equal to 5, the first film layer is a silicon nitride layer, and the second film layer is a silicon oxide layer.

Optionally, in some embodiments of the present application, the thin film transistor substrate further includes a gate insulating layer, a gate electrode, an interlayer insulating layer, and a source-drain layer stacked on the active layer in sequence, and an orthographic projection of the gate electrode on the substrate covers an orthographic projection of the channel on the substrate.

Optionally, in some embodiments of the present application, the gate insulating layer includes an inclined part, the inclined part covers a part of the active layer located on the side wall;
 the gate electrode includes a gate sidewall located on the inclined part, and a slope angle of the gate sidewall on the inclined part is greater than or equal to 30° and less than or equal to 60°.

Optionally, in some embodiments of the present application, the active layer further includes a first doped area and a second doped area located on two opposite sides of the channel and connected to the channel, the source-drain layer includes a source electrode and a drain electrode, and the source electrode and drain electrode are connected to the first doped area and the second doped area through vias respectively;
 wherein the boss includes a first film layer and a second film layer, the first film layer and the second film layer are stacked on the substrate in sequence, and at a junction of the first film layer and the second film layer, the first film layer is partially indented inward to define the undercut structure; the first doped area is located on a top part of the second film layer, and the second doped area is located on the substrate and disposed on a same layer with the first film layer.

Optionally, in some embodiments of the present application, the channel includes a first channel and a second channel, the undercut structure includes a first undercut structure and a second undercut structure located on two sides of the boss, the first channel covers the first undercut structure, and the second channel covers the second undercut structure;
 the active layer further includes a first doped area located between the first channel and the second channel and disposed on a top part of the boss, a second doped area disposed opposite to the first doped area on another side of the first channel and located on the substrate, and a third doped area disposed opposite to the first doped area on another side of the second channel and located on the substrate; the source-drain layer includes a first source electrode, a second source electrode, and a drain electrode, the drain electrode is connected to the first doped area through a via, the first source electrode is connected to the second doped area through a via, the second source electrode is connected to the third doped area through a via, and the first source electrode and the second source electrode are electrically connected to each other.

Optionally, in some embodiments of the present application, the channel includes a first channel and a second channel, the undercut structure includes a first undercut structure and a second undercut structure located on two sides of the boss, the first channel covers the first undercut structure, and the second channel covers the second undercut structure;

the active layer further includes a first doped area located between the first channel and the second channel and disposed on a top part of the boss, a second doped area disposed opposite to the first doped area on another side of the first channel and located on the substrate, and a third doped area disposed opposite to the first doped area on another side of the second channel and located on the substrate; the source-drain layer includes a source electrode and a drain electrode, the source electrode is connected to the second doped area through a via, and the drain electrode is connected to the third doped area through a via.

The present application further provides the electronic device, the electronic device includes a thin film transistor substrate of any embodiment of the present application.

Beneficial effects: the present application provides the thin film transistor substrate and the electronic device. By disposing the boss including the undercut structure on the thin film transistor substrate, in a laser annealing process, material of the active layer in the undercut structure is used as seed and finally forms the channel composed of single-crystal grains, which reduces a length of the channel of the thin film transistor, and is conducive to improving integration of the thin film transistor on the substrate. Since crystal boundaries do not exist in the channel composed of the single-crystal grains, mobility of the thin film transistor can be improved.

DETAILED DESCRIPTION OF THE EMBODIMENT

The following will give a clear and complete description of technical solutions in solutions and/or embodiments of the present application in combination with specific embodiments of the present application. It is obvious that the solutions and/or the embodiments described below are only part of the solutions and/or the embodiments of the present application, not all of them. Based on the solutions and/or the embodiments of the present application, all other solutions and/or embodiments obtained by those skilled in the art without creative effort belong to a protection scope of the present application.

Directional terms mentioned in the present application, such as [up], [down], [left], [right], [front], [back], [inside], [outside], [side], etc. are only directions referring to additional drawings. Therefore, the directional terms are used to explain and understand the present application, not to limit the present application. Terms "first", "second", etc. are only used for a description purpose and cannot be understood as indicating or implying their relative importance or implicitly indicating a quantity of indicated technical features. Thus, a feature defined as "first", "second", etc. may explicitly or implicitly include one or more of the features.

Figure 1:
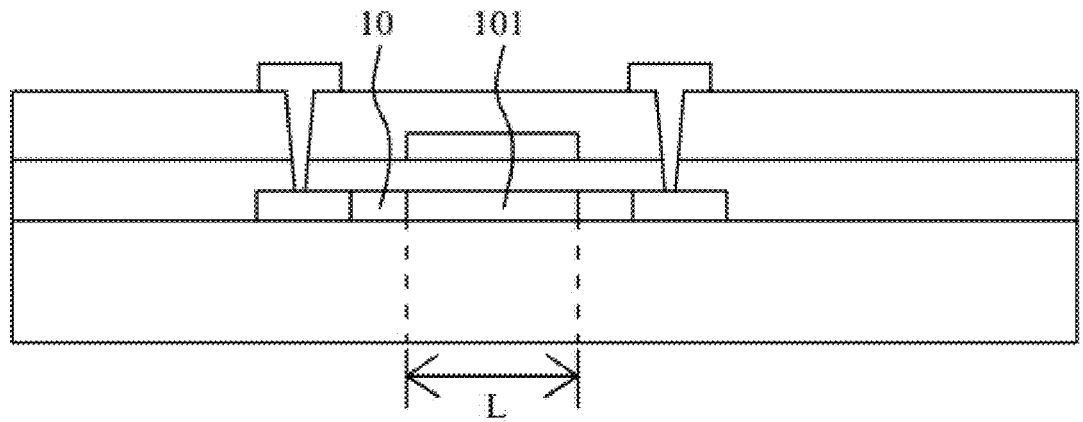
FIG. 1 is a schematic structural diagram of a thin film transistor substrate in the prior art.

Please refer to FIG. 1, FIG. 1 is a schematic structural diagram of a thin film transistor substrate in the prior art. It can be seen from FIG. 1 that in the traditional thin film transistor substrate, an active layer 10 is located on a plane, and a length L of a channel 101 of the active layer 10 is generally greater than 2 µm, which makes the channel of the traditional thin film transistors too long and an area proportion of the traditional thin film transistors on the substrate too large, and thus is not conducive to high-density integration of thin film transistors on the substrate. In addition, since the channel 101 with a length being greater than 2 µm is composed of multiple-crystal grains, the channel exists more crystal boundaries and thus results in low mobility of the thin film transistors.

To solve the above-mentioned problems, the present application provides a thin film transistor substrate. The thin film transistor substrate includes: a substrate; a boss, wherein the boss includes an undercut structure, the undercut structure is located on a side wall of the boss; a filler, wherein the filler is located in the undercut structure; and an active layer, wherein the active layer is located on the boss and the substrate, the active layer includes a channel, and the channel covers the undercut structure and the filler.

By disposing the boss including the undercut structure on the thin film transistor substrate, in a laser annealing process, material of the active layer in the undercut structure is used as seed and finally forms the channel composed of single-crystal grains, which reduces a length of the channel of the thin film transistor, and is conducive to improving integration of the thin film transistor on the substrate. Since crystal boundaries do not exist in the channel composed of the single-crystal grains, mobility of the thin film transistor can be improved.

The thin film transistor substrate provided by the present application is explained in detail by specific embodiments and in combination with drawings.

Embodiment 1

Figure 2:
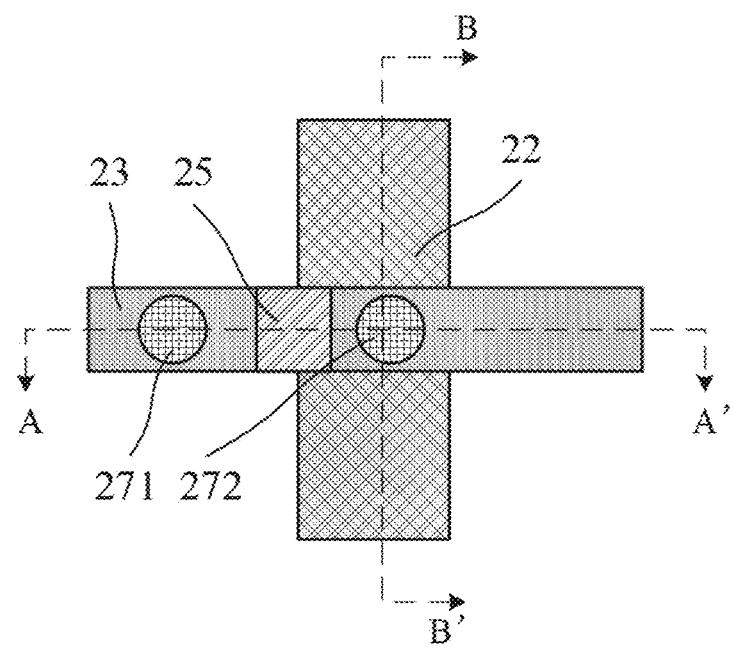
FIG. 2 is a first top schematic structural diagram of a thin film transistor substrate provided by an embodiment of the present application.
Figure 3:
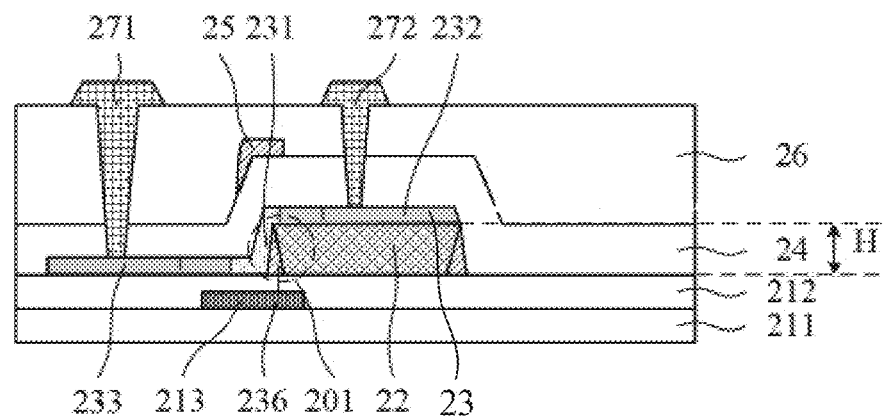
FIG. 3 is a sectional diagram taken along a line of AA' in FIG. 2.
Figure 4:
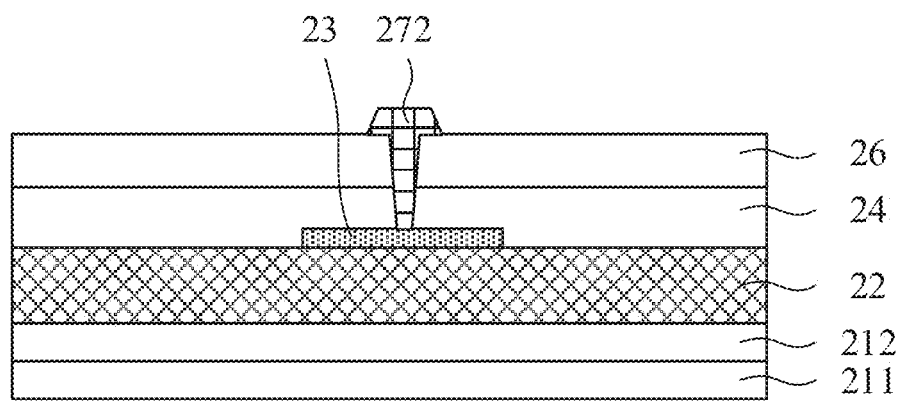
FIG. 4 is a sectional diagram taken along a line of BB' in FIG. 2.
Figure 5:
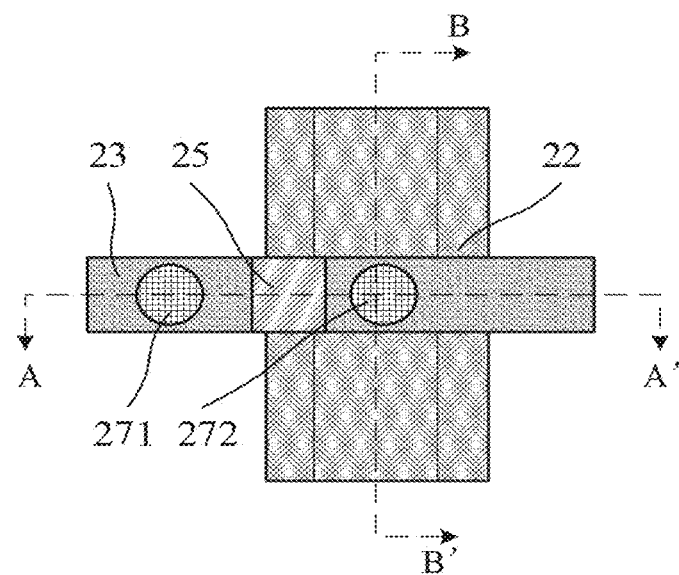
FIG. 5 is a second top schematic structural diagram of the thin film transistor substrate provided by the embodiment of the present application.

Please refer to FIG. 2 to FIG. 4. FIG. 2 is a first top schematic structural diagram of the thin film transistor substrate provided by the embodiment of the present application; FIG. 3 is a sectional diagram taken along a line of AA' in FIG. 2; and FIG. 4 is a sectional diagram taken along a line of BB' in FIG. 2. In the embodiment, the thin film transistor substrate includes the substrate, the filler 236, the boss 22, and the active layer 23.

The substrate includes an insulating substrate 211, a light-shielding part 213, and a buffer layer 212. The light-shielding part is located between the insulating substrate 211 and the buffer layer 212. The insulating substrate 211 may be a glass substrate or a flexible substrate. An orthographic projection of the light-shielding part 213 on the insulating substrate 211 covers an orthographic projection of the channel 231 on the insulating substrate 211. The light-shielding part 213 plays a role of shielding light emitted from a side of the insulating substrate 211. A material of the light-shielding part 213 is a metal material. The metal material includes but is not limited to at least one of molybdenum, aluminum, titanium, copper, and silver. The material of the light-shielding part 213 may be black organic photoresist, etc. The buffer layer 212 covers the insulating substrate 211 and the light-shielding part 213. A material of the buffer layer 212 includes at least one of silicon nitride and silicon oxide. A thickness of the buffer layer 212 is greater than or equal to 2500 Å and less than or equal to 3500 Å, such as 2500 Å, 2800 Å, 3000 Å, 3200 Å, or 3500 Å. In other embodiments, the substrate may be other structures well known in the art, which is not limited here.

The boss 22 is located on the substrate, specifically located on the buffer layer 212. The boss 22 includes the undercut structure 201. The undercut structure 201 is located on the side wall of the boss 22. The boss 22 may be formed by overlapping one film layer, two film layers, or more than two film layers. Film layers constituting the boss 22 includes an insulating layer. The insulating layer includes at least one of an inorganic insulating layer and an organic insulating layer. A material of the inorganic insulating layer includes but is not limited to silicon oxide or silicon nitride. A material of the organic insulating layer includes but is not limited to polyimide, polyacrylate, and organic silicon, etc. The film layers constituting the boss 22 may further include a conductive film layer.

The filler 236 is located in the undercut structure 201. The filler is amorphous silicon.

The active layer 23 is located on the boss 22 and the buffer layer 212. The active layer 23 includes the channel 231, and a first doped area 232 and a second doped area 233 respectively located on two sides of the channel 231 in a length direction of the channel 231. Both the first doped area 232 and the second doped area 233 include a heavily-doped area, and a lightly-doped area located between the heavily-doped area and the channel 231.

A length of the channel 231 is greater than or equal to 0.01 μm and less than or equal to 1 μm. A width of the channel 231 is greater than or equal to 0.03 μm and less than or equal to 10 μm. The length is a size of the channel 231 in a direction perpendicular to a width direction of the channel 231. The width is a size of the channel 231 in a direction parallel to the substrate. The length is also a size of the channel 231 in a direction of connecting the doped areas. In this way, the length of the channel 231 is reduced in compared with a length of channels in the traditional thin film transistors (with a length being greater than 2 μm), which is conducive to improving integration of the thin film transistor on the substrate. On another hand, the channel 231 covers the undercut structure 201, and the undercut structure 201 is located on the side wall of the boss 22. Therefore, the channel 231 covers at least a part of the side wall of the boss 22. Compared with the traditional thin film transistors in which the channel is located on a plane structure, the channel 231 in the present application occupies a less area on the thin film transistor substrate for the channel with a same length, which is more conducive to improving the integration of the thin film transistor on the substrate.

The channel 231 may be located on a part of the side wall of the boss 22. For example, the channel 231 only covers the undercut structure 201 and the part of the side wall, and does not extend to a top surface of the boss 22. The top surface is a surface of the boss 22 away from the substrate. Alternatively, the channel 231 covers a side wall of the substrate and extends to the top surface of the boss 22. The heavily-doped areas on two sides of the channel 231 are respectively located on the top surface of the boss 22, and the buffer layer 212.

The channel 231 covers the undercut structure 201, and the channel 231 in a part or all includes single-crystal grains, that is, the channel 231 is composed of the single-crystal grains. In this way, crystal boundaries do not exist in the channel 231, which can improve mobility of the thin film transistor. The channel 231 may further include multiple-crystal grains, in other words, the channel 231 includes multiple crystal boundaries. Since the channel 231 is disposed on the side wall of the boss 22, the length of the channel 231 can be reduced ranging from 0.01 μm to 1 μm, and a quantity of the crystal boundaries in the channel 231 can be correspondingly reduced, which can further improve the mobility of the thin film transistor.

In the embodiment of the present application, a size of the single-crystal grain constituting the channel 231 is greater than or equal to 0.25 μm, so as to compliant to a size of a crystal grain formed by amorphous silicon after being crystallized by a laser annealing process in the prior art. For example, the size of the single grain can be 0.28 μm, 0.29 μm. 0.30 μm, 0.32 μm. 0.35 μm, 0.36 μm, 0.38 μm, or 0.4 μm.

It should be noted that the size of the crystal grain formed by the amorphous silicon after being crystallized by the laser annealing process in the prior art is smaller, and a difference between the size of the crystal grain and the length of the channel (greater than 2 μm) in the prior art is larger, which cannot form the channel composed of single-crystal grains. In the present application, a thickness of the boss 22 is controlled to reduce the length of the channel, so that the length of the channel tends to be the same as the size of the single-crystal grain in the laser annealing process of the prior art. In addition, material of the active layer in the undercut structure 201 is easier to form seed, providing conditions for the seed to grow along a side wall of the undercut structure 201 to form the single-crystal grains, and thus providing conditions for a formation of channels composed of the single-crystal grains with smaller lengths.

The active layer 23 is a low-temperature polysilicon active layer or a crystallized metal oxide active layer, etc. In some embodiments, the active layer 23 is the low-temperature polysilicon active layer. In some embodiments, a material of the channel 231 is a polycrystalline silicon material, and the polycrystalline silicon material is obtained by laser irradiation of amorphous silicon.

A ratio of the thickness H of the boss 22 to a thickness of the active layer 23 is greater than or equal to 2 and less than or equal to 7. The thickness of the active layer 23 is generally greater than or equal to 350 Å and less than or equal to 600 Å. Therefore, the thickness H of the boss 22 is greater than or equal to 700 Å and less than or equal to 4200

Å. For example, the ratio of the thickness H of the boss 22 to the thickness of the active layer 23 is 2, 2.2, 2.5, 2.8, 3, 3.2, 3.5, 3.8, 4.0, 4.2, 4.4, 4.6, 4.8, 5.0, 5.2, 5.5, 5.8, 6.0, 6.2, 6.5, 6.8, or 7.0. The thickness of the active layer 23 is 350 Å, 380 Å, 400 Å, 420 Å. 440 Å, 460 Å, 480 Å, 500 Å, 520 Å, 540 Å, 560 Å, or 600 Å. The thickness H of the boss 22 corresponds to be 1000 Å, 1200 Å, 1400 Å, 1600 Å, 1800 Å, 2000 Å, 2200 Å. 2400 Å. 2600 Å, 2800 Å, or 3000 Å.

By controlling the thickness of the boss 22, a length of the side wall of the boss 22 can be adjusted, and then the length of the channel 231 deposited on the side wall of the boss 22 can be controlled, so that the length of the channel 231 is less than or equal to 1 μm. Ideally, the channel 231 is located on the side wall of the boss 22 and just covers the side wall of the boss 22, that is, the channel 231 extends along the side wall of the boss 22 and stops at a junction of the top surface of the boss 22 and the side wall, and at a position where the undercut structure 201 is located. However, due to process deviation, the channel 231 may not be an ideal case. The channel 231 may extend along the side wall of the boss 22 and stop at the side wall of the boss 22, the channel 231 may extend along the top surface of the boss 22, or the channel 231 may extend along the buffer layer 212.

In this embodiment, the top surface of the boss 22 and a side wall of the buffer layer 212 are recessed toward inside of the boss 22 to define the undercut structure 201.

The thin film transistor substrate further includes a gate insulating layer 24, a gate electrode 25, an interlayer insulating layer 26, and a source-drain layer stacked on the active layer 23 in sequence.

The gate insulating layer 24 covers the active layer 23. The gate insulating layer 24 includes an inclined part. The inclined part covers a part of the active layer 23 located on the side wall. A material of the gate insulating layer 24 includes at least one of silicon nitride and silicon oxide. A thickness of the gate insulating layer 24 is greater than or equal to 500 Å and less than or equal to 1500 Å. For example, the thickness of the gate insulating layer 24 is 600 Å, 800 Å, 1000 Å, 1200 Å. 1400 Å, or 1500 Å.

An orthographic projection of the gate electrode 25 on the substrate covers an orthographic projection of the channel 231 on the substrate. The gate electrode 25 includes a gate sidewall located on the inclined part. A slope angle α of the gate sidewall on the inclined part is greater than or equal to 30° and less than or equal to 60°, so as to adapt to a manufacturing process of the gate electrode 25. Further, the slope angle α may be greater than or equal to 40° and less than or equal to 55°. Furthermore, the slope angle α may be greater than or equal to 45° and less than or equal to 50°. For example, the slope angle α may be 30°, 40°. 45°, 48°, 50°. 52°, 55°, 58°, or 60°.

The gate electrode 25 may be only disposed on the inclined part, or be disposed on the inclined part and extend to a platform part of the gate insulating layer 24, so as to compliant to the channel 231. The platform part is a structure connected to the inclined part and located above the boss, referring to FIG. 3 for details. A material of the gate electrode 25 is selected from at least one of molybdenum, aluminum, titanium, copper, and silver.

A material of the interlayer insulating layer 26 is selected from at least one of silicon nitride and silicon oxide. A thickness of the interlayer insulating layer 26 is greater than or equal to 5000 Å and less than or equal to 6500 Å, such as 5200 Å. 5400 Å, 5500 Å. 5600 Å, or 5800 Å.

The source-drain layer includes a source electrode 271 and a drain electrode 272. The source electrode 271 and the drain electrode 272 are respectively connected to the second doped area 233 and the first doped area 232 through a via, specifically connected to the heavily-doped areas within the second doped area 233 and the first doped area 232. A material of the source-drain layer is selected from at least one of molybdenum, aluminum, titanium, copper, and silver.

Embodiment 2

Please refer to FIG. 5 to FIG. 9. Same or similar features with the embodiment 1 will not be described in the embodiment 2. Differences between the embodiment 2 and the embodiment 1 include: the boss 22 includes a first film layer 221 and a second film layer 222; the first film layer 221 is located between the second film layer 222 and the buffer layer 212; the undercut structure 201 is defined by a bottom surface of the second film layer 222 and a side wall of the first film layer 221; the bottom surface is a surface of the second film layer 222 contacting the first film layer 221.

A distance D between an edge of the bottom surface and the side wall of the first film layer 221 is greater than or equal to 0.3 μm and less than or equal to 1 μm. The distance D matches the size of the single-crystal grain, so that the undercut structure 201 can accommodate the material of the active layer in a subsequent manufacturing process of the active layer 23, and in the laser annealing process, material of the active layer in the undercut structure 201 can be used as seed to form the channel 231 composed of the single-crystal grains outward. The undercut structure 201 provides a great condition for the formation of the seed, which can greatly improve a production yield of the single-crystal grains.

A thickness H2 of the second film layer 222 is greater than a thickness H1 of the first film layer 221. In some embodiments, a ratio of the thickness H2 of the second film layer 222 to the thickness H1 of the first film layer 221 is greater than or equal to 2 and less than or equal to 5. For example, in some embodiments, the thickness H1 is 200 Å and the thickness H2 is 800 Å. In some embodiments, the thickness H1 is 300 Å and the thickness H2 is 1000 Å. In some embodiments, the thickness H1 is 400 Å and the thickness H2 is 1200 Å. In some embodiments, the thickness H1 is 500 Å and the thickness H2 is 1400 Å. In some embodiments, the thickness H1 is 600 Å and the thickness H2 is 1500 Å. In some embodiments, the thickness H1 is 700 Å and the thickness H2 is 1600 Å. In some embodiments, the thickness H1 is 800 Å and the thickness H2 is 1800 Å. In some embodiments, the thickness H1 is 1000 Å and the thickness H2 is 2000 Å. In this way, the thickness of the first film layer 221 is relatively less, therefore, the size of the undercut structure 201 formed is smaller. After the laser annealing process, there are fewer seed left in the undercut structure 201, which makes it easier to grow single-crystal grains with high-quality.

An included angle β between the top surface of the second film layer 222 and the side wall of the second film layer 222 is greater than 90°. The top surface is a surface opposite to the bottom surface. The side wall is a surface connecting the top surface and the bottom surface. The side wall and the channel are located on a same side of the boss 22. In this way, the thickness of the second film layer 222 gradually increases in a direction away from the substrate, which is conducive to a deposition of the material the active layer on the boss 22. Furthermore, the included angle ß between the top surface of the second film layer 222 and the side wall of the second film layer 222 is less than or equal to 135°, so that the length of the side wall of the boss 22 is not too long, which is conducive to controlling the length of the channel 231. The side wall of the second film layer 222 may be a plane structure or a curved surface structure, and there is no limitation here.

Figure 6:
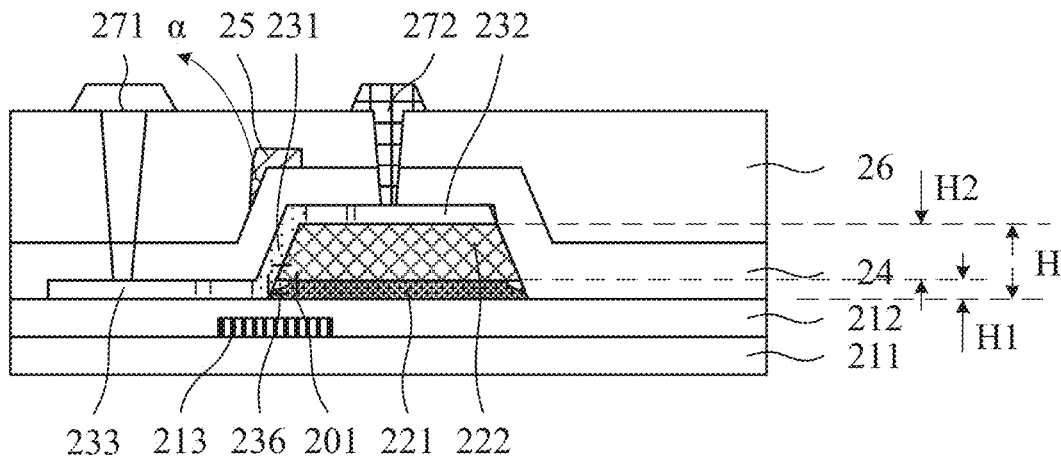
FIG. 6 is a first sectional diagram taken along a line of AA' in FIG. 5.

In an embodiment, please refer to FIG. 6. The undercut structure 201 is defined by a part of the bottom surface of the second film layer 222 and a part of the side wall of the first film layer 221. The undercut structure 201 is located at a junction of the first film layer 221 and the second film layer 222, and is recessed toward inside the first film layer 221.

Figure 7:
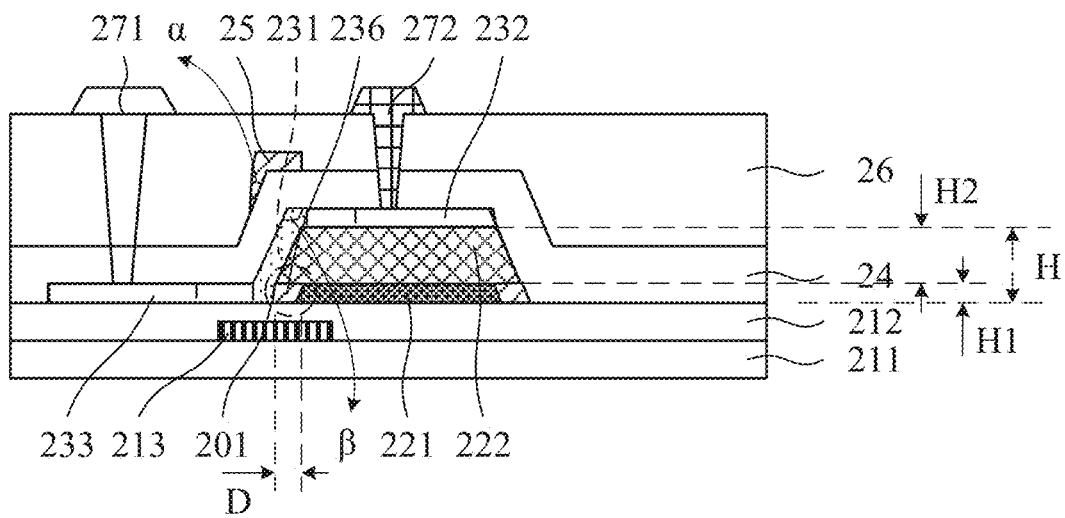
FIG. 7 is a second sectional diagram taken along a line of AA' in FIG. 5.
Figure 8:
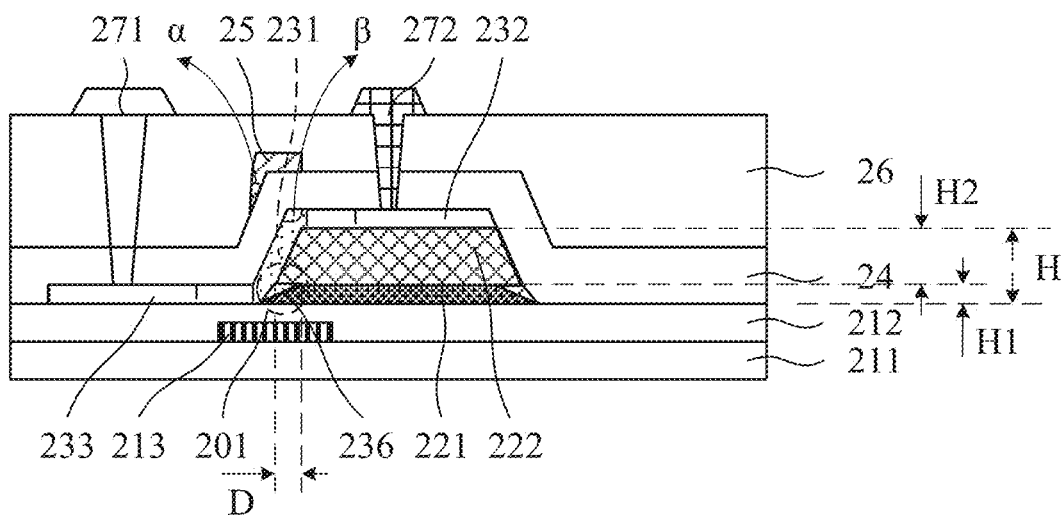
FIG. 8 is a third sectional diagram taken along a line of AA' in FIG. 5.
Figure 9:
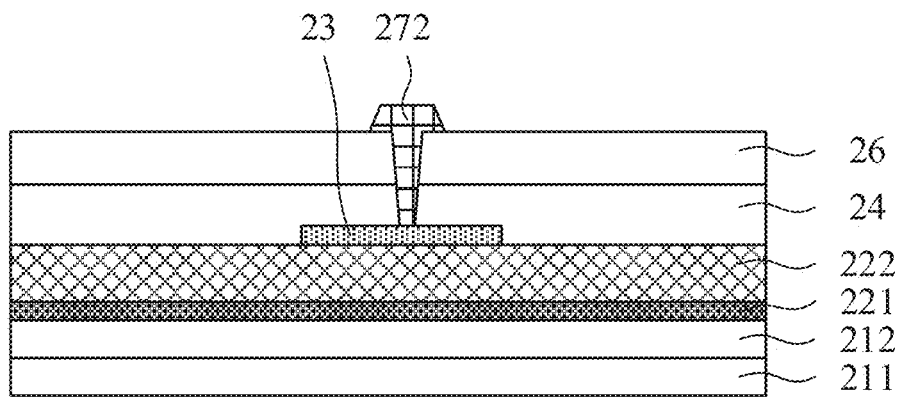
FIG. 9 is a sectional diagram taken along a line of BB' in FIG. 5.

In another embodiment, please refer to FIG. 7 and FIG. 8. The undercut structure 201 is defined by the part of the bottom surface of the second film layer 222 and an entire side wall of the first film layer 221, that is, the undercut structure 201 extends to the buffer layer 212. In an embodiment, an orthographic projection of the second film layer 222 on the insulating substrate 211 covers an orthographic projection of the first film layer 221 on the insulating substrate 211, as shown in FIG. 7. In other embodiments, the orthographic projection of the second film layer 222 on the insulating substrate 211 partially overlaps the orthographic projection of the first film layer 221 on the insulating substrate 211. Further, the orthographic projection of the first film layer 221 on the insulating substrate 211 covers the orthographic projection of the second film layer 222 on the insulating substrate 211, as shown in FIG. 8. Alternatively, a part of the orthographic projection of the first film layer 221 on the insulating substrate 211 is located outside the orthographic projection of the second film layer 222 on the insulating substrate 211, and a part of the orthographic projection of the second film layer 222 on the insulating substrate 211 is located outside the orthographic projection of the first film layer 221 on the insulating substrate 211. The side wall of the first film layer 221 may be a plane structure or a curved surface structure, which is not limited here.

In an embodiment, the first film layer 221 is a silicon nitride layer, and the second film layer 222 is a silicon oxide layer. The undercut structure 201 may be prepared by a dry etching process. In other embodiments, the first film layer 221 and the second film layer 222 may be other film layers, as long as the undercut structure 201 can be formed by the first film layer 221 and the second film layer 222.

The channel 231 covers the undercut structure 201 and extends to at least a part of the sidewall of the second film layer 222. The channel 231 may extend to the junction of the top surface and the side surface of the second film layer 222, and may further extend to the top surface of the second film layer 222, according to actual manufacturing processes and designs of the channel.

Embodiment 3

Figure 10:
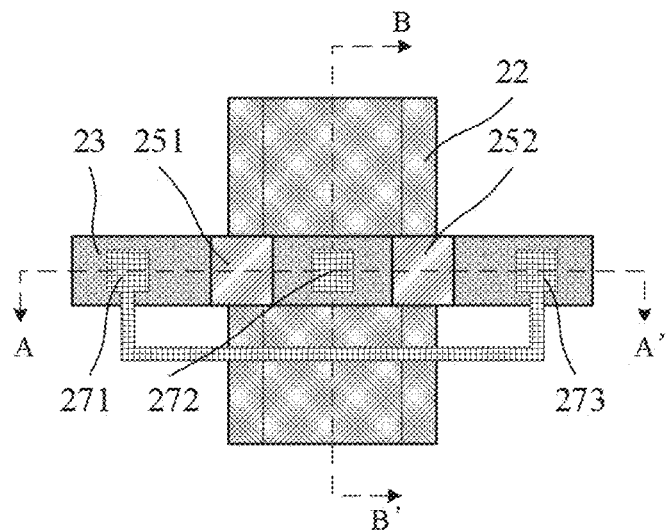
FIG. 10 is a third top schematic structural diagram of the thin film transistor substrate provided by the embodiment of the present application.
Figure 11:
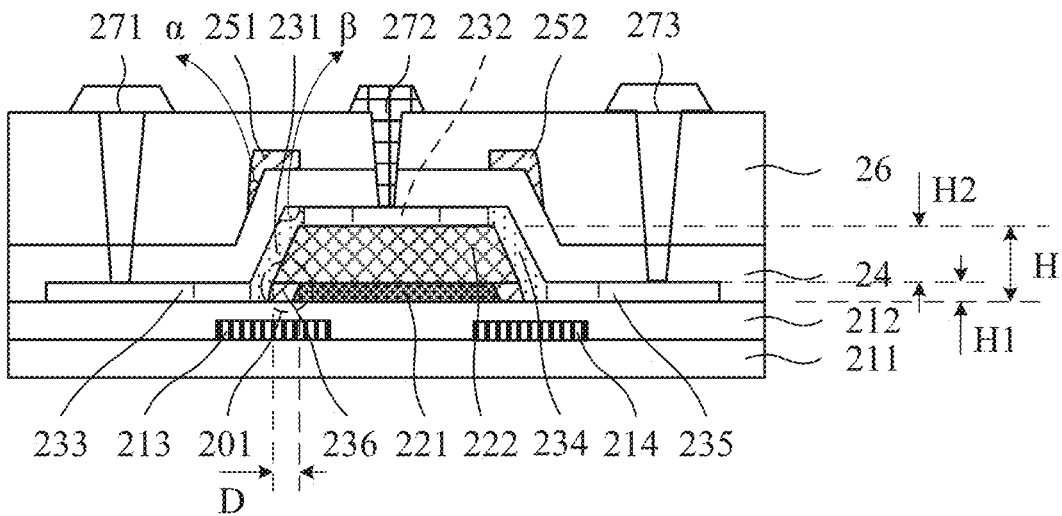
FIG. 11 is a sectional diagram taken along a line of AA' in FIG. 10.
Figure 12:
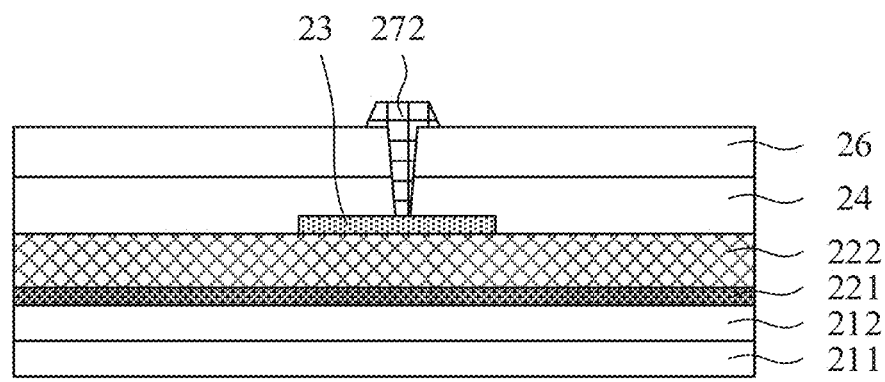
FIG. 12 is a sectional diagram taken along a line of BB' in FIG. 10.

Please refer to FIG. 10 to FIG. 12. Same or similar features with the embodiment 2 will not be described in the embodiment 3. Differences between the embodiment 3 and the embodiment 2 include: the active layer 23 includes a first channel 231, a second channel 234, the first doped area 232 connecting the first channel 231 and the second channel 234, the second doped area 233 disposed opposite to the first doped area 232 on another side of the first channel 231, and a third doped area 235 disposed opposite to the first doped area 232 on another side of the second channel 234; the first channel 231 and the second channel 234 are respectively disposed on the side walls of opposite two sides of the boss 22; the side walls on the opposite two sides of the boss 22 are both provided with the undercut structure 201; the first channel 231 and the second channel 234 respectively cover the corresponding undercut structure 201. An arrangement method of the first channel 231 and the second channel 234 is similar to an arrangement method of the channel 231 in the first embodiment. Please refer to the above-mentioned embodiment for details, and will not be repeated here.

The source-drain layer includes a first source electrode 271, a second source 273, and a drain electrode 272. The drain electrode 272 is connected to the first doped area 232 through a via. The first source electrode 271 is connected to the second doped area 233 through a via. The second source 273 is connected to the third doped area 235 through a via. The first source electrode 271 and the second source 273 are electrically connected to each other.

The thin film transistor substrate includes a first gate electrode 251 and a second gate electrode 252. Both the first gate electrode 251 and the second gate electrode 252 are disposed on the gate insulating layer 24. An orthographic projection of the first gate electrode 251 on the substrate overlaps an orthographic projection of the first channel 231 on the substrate. The first gate electrode 251 and the second gate electrode 252 are similar to the gate electrode 25 in the embodiment 1. Please refer to the embodiment 1 for details, and will not be repeated here.

The thin film transistor substrate includes a first light-shielding part 213 and a second light-shielding part 214. The first light-shielding part 213 and the second light-shielding part 214 are disposed between the insulating substrate 211 and the buffer layer 212. An orthographic projection of the first light-shielding part 213 on the insulating substrate 211 covers the orthographic projection of the first channel 231 on the insulating substrate 211. An orthographic projection of the second light-shielding part 214 on the insulating substrate 211 covers an orthographic projection of the second channel 234 on the insulating substrate 211. The first light-shielding part 213 and the second light-shielding part 214 are similar to the light-shielding part 213 in the embodiment 1. Please refer to the embodiment 1 for details and will not be repeated here.

In the embodiment 3, by disposing two channels composed of the single-crystal grains on the side wall of the boss, and connecting the two channels in parallel, an equivalent width of the thin film transistor can be increased compared with the embodiment 2.

Embodiment 4

Figure 13:
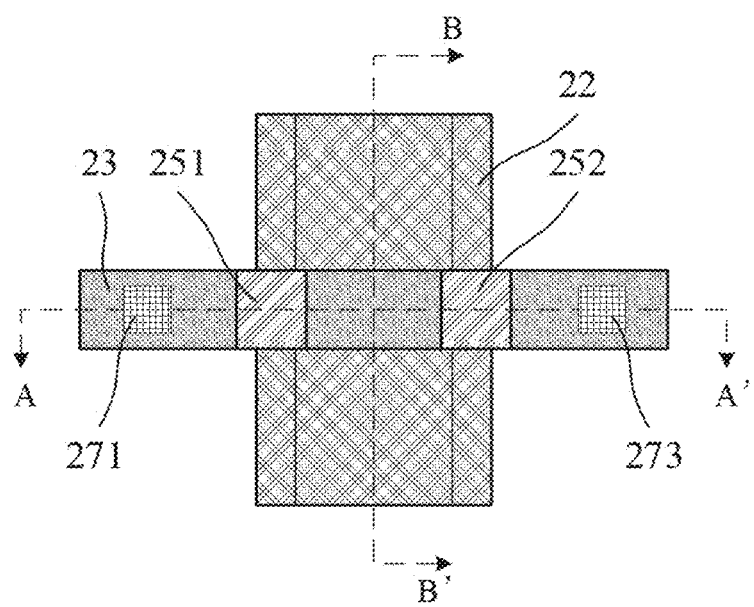
FIG. 13 is a fourth top schematic structural diagram of the thin film transistor substrate provided by the embodiment of the present application.
Figure 14:
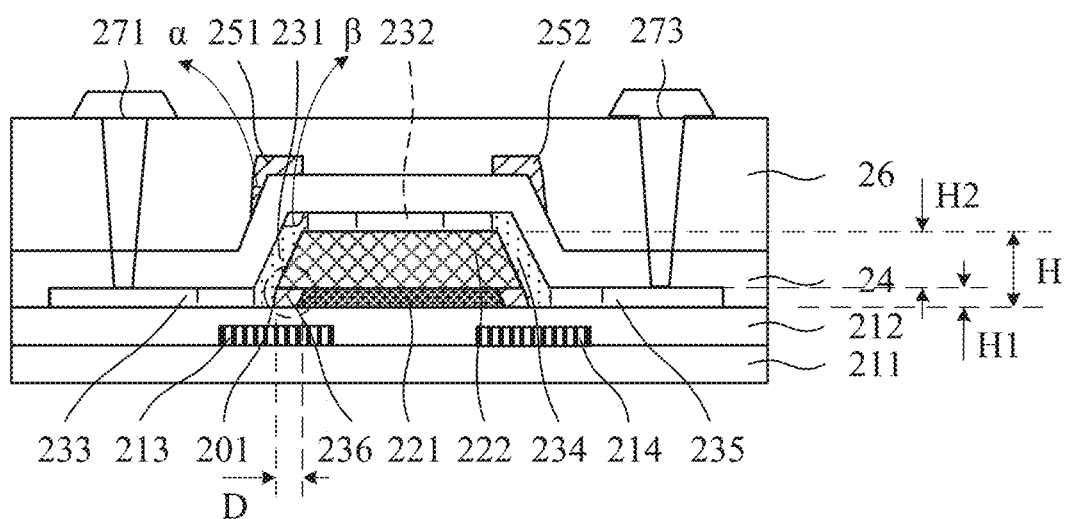
FIG. 14 is a sectional diagram taken along a line of AA' in FIG. 12.
Figure 15:
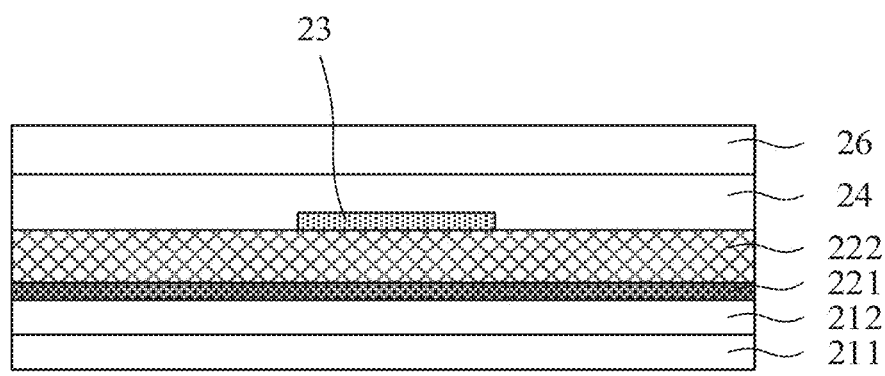
FIG. 15 is a sectional diagram taken along a line of BB' in FIG. 12.

Please refer to FIG. 13 to FIG. 15. Same or similar features with the embodiment 3 will not be described in the embodiment 4. Differences between the embodiment 4 and the embodiment 3 include: the source-drain layer includes a source electrode 271 and a drain electrode 273, the source electrode 271 is connected to the second doped area 233 through a via, and the drain electrode 273 is connected to the third doped area 235 through a via.

In the embodiment 4, by disposing two channels composed of the single-crystal grains on the side wall of the boss, and connecting the two channels in parallel, an equivalent width of the thin film transistor can be increased compared with the embodiment 2.

Figure 16:
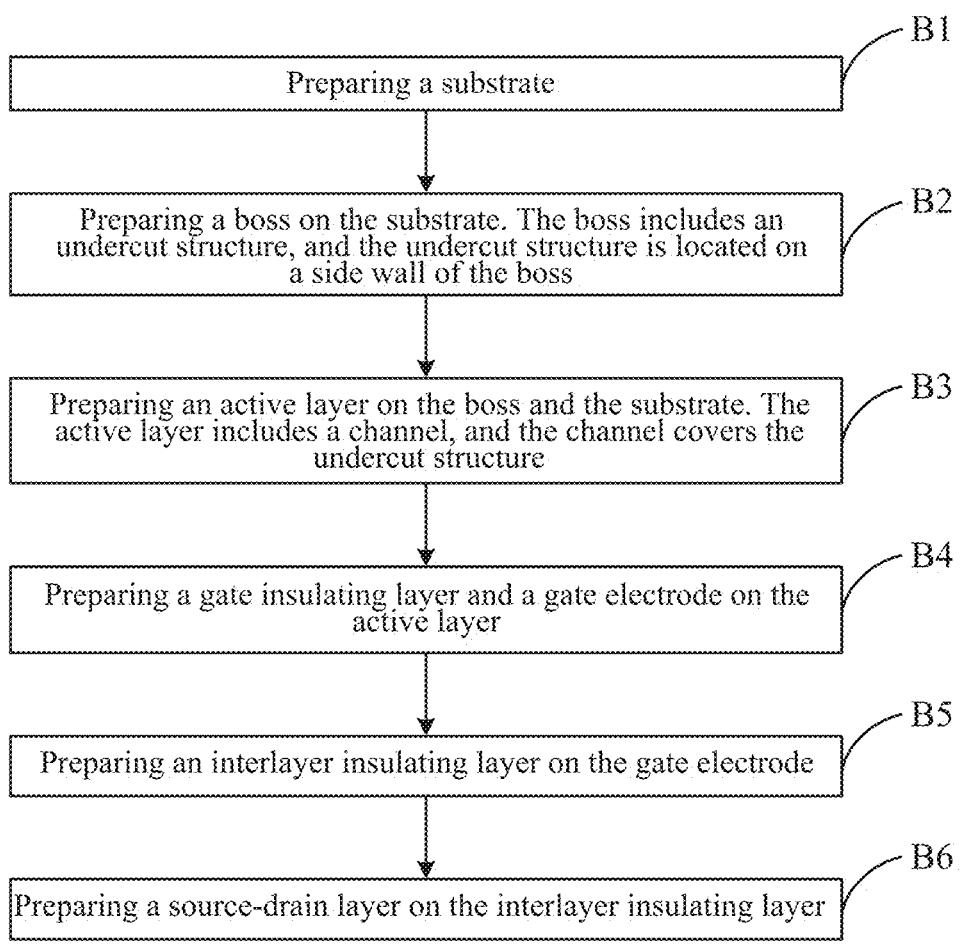
FIG. 16 is a flow chart of a manufacturing method of a thin film transistor substrate provided by an embodiment of the present application.

Correspondingly, an embodiment of the present application further provides a manufacturing method of the thin film transistor substrate for preparing the thin film transistor substrate described in any embodiment of the present application. Please refer to FIG. 16 and FIG. 17. The manufacturing method includes following steps.

Step B1: preparing the substrate. Please refer to a structure shown in FIG. 17 (a). Specific steps of preparing the substrate include: providing the insulating substrate 211;

preparing the light-shielding part 213 on the insulating substrate; and preparing the buffer layer 212 on the light-shielding part 213 and the insulating substrate 211.

Step B2: preparing the boss on the substrate. The boss includes the undercut structure, and the undercut structure is located on the side wall of the boss, referring to a structure shown in FIG. 17 (b).

Specifically, steps of preparing the boss on the substrate includes following steps:

depositing a silicon nitride film layer 221 and a silicon oxide film layer 222 on the substrate in sequence by a chemical vapor deposition process;

in an atmosphere of mixed gases containing $C_2HF_5$, Ar, and $H_2$, etching the silicon nitride film layer 221 and the silicon oxide film layer 222 to form an inclined side surface by a dry etching process, wherein it should be mentioned that an etching rate of the silicon oxide film layer 222 and an etching rate of the silicon nitride film layer 221 are similar in the atmosphere of mixed gases containing $C_2HF_5$, Ar, and $H_2$, so that the side surface obtained are relatively smooth; and in an atmosphere of mixed gases containing $SF_6$ and $O_2$, etching the silicon nitride film layer 221 and the silicon oxide film layer 222 to form the boss by a dry etching process again. It should be mentioned that the etching rate of the silicon oxide film layer 222 is less while the etching rate of the silicon nitride film layer 221 is greater in the atmosphere of mixed gases containing $SF_6$ and $O_2$, and therefore, after etching, the undercut structure 201 is defined by a side of the side wall of the boss close to the buffer layer 212.

Step B3: preparing the filler and the active layer on the boss and the substrate. The filler is located in the undercut structure, the active layer includes the channel, and the channel covers the undercut structure and the filler, referring to a structure shown in FIG. 17 (c).

Specifically, the step of preparing the active layer 23 on the boss and the substrate includes following steps:

depositing an amorphous silicon film on the boss and the substrate by a chemical vapor deposition process, and wherein the amorphous silicon film fills the undercut structure and covers the side wall of the undercut structure;

performing an annealing treatment on the amorphous silicon film by an excimer laser annealing process, wherein it should be mentioned that amorphous silicon in the undercut structure will be used as seed in the above-mentioned process, the seed grow into single-crystal grains along the active layer located on the side wall of the boss, and at least a part of the single-crystal grains is used as the channel of the thin film transistor, and wherein by controlling the length of the side wall of the boss, only the single-crystal grains can exist on the side wall of the boss, and after laser annealing, part of the amorphous silicon at a deeper position inside the undercut structure is not treated, and is retained in the undercut structure in a form of the filler, and the amorphous silicon film located on the side wall of the boss is converted into polysilicon;

patterning the annealed amorphous silicon thin film transistor to obtain an active layer pattern 23; and performing a lightly-doped treatment and a heavily-doped treatment on the active layer pattern 23; or only performing the heavily-doped treatment on the active layer pattern 23, and the lightly-doped treatment is performed in a subsequent process.

Figure 17:
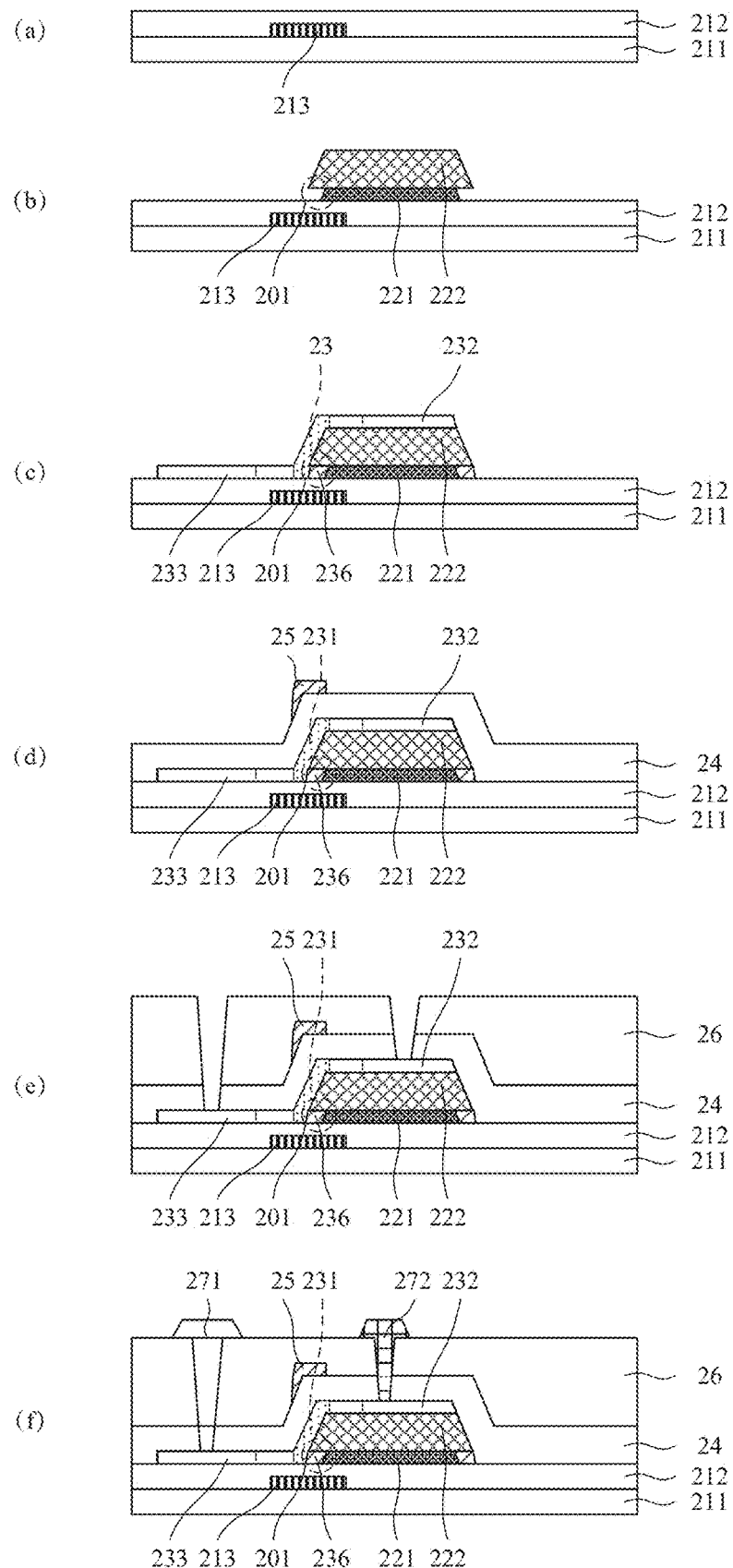
FIG. 17 is a structural diagram of the manufacturing method of the thin film transistor substrate provided by the embodiment of the present application.

Step B4: preparing the gate insulating layer and the gate electrode on the active layer, referring to a structure shown in FIG. 17 (d).

The step B4 may further includes: after the preparation of the gate electrode 25, performing a lightly-doped treatment on the active layer pattern with the gate electrode 25 as a self-aligning mask.

Step B5: preparing the interlayer insulating layer on the gate electrode, referring to a structure shown in FIG. 17 (e).

Step B6: preparing the source-drain layer on the interlayer insulating layer, referring to a structure shown in FIG. 17 (f).

An embodiment of the present application further provides an electronic device. The electronic device includes the thin film transistor substrate described in any embodiment of the present application. The electronic device may be an integrated circuit board including the thin film transistor substrate, or the electronic device may be a display panel including the thin film transistor substrate. The display panel may be any one of a liquid crystal display panel, an organic light-emitting diode display panel, a quantum dot display panel, a micro light-emitting diode display panel, or a submillimeter light-emitting diode display panel. The electronic devices may be other electronic devices including the thin film transistor substrate.

To sum up, embodiments of the present application provide the thin film transistor substrate and the electronic device. The thin film transistor substrate includes: the substrate; the boss including the undercut structure, wherein the undercut structure is located on the side wall of the boss; and the active layer located on the boss and the substrate, wherein the active layer includes the channel, and the channel covers the undercut structure. By disposing the boss including the undercut structure on the thin film transistor substrate, in a laser annealing process, material of the active layer in the undercut structure are used as seed and finally forms the channel composed of single-crystal grains, which reduces the length of the channel of the thin film transistor, and is conducive to improving the integration of the thin film transistor on the substrate. Since crystal boundaries do not exist in the channel composed of the single-crystal grains, mobility of the thin film transistor can be improved.

The thin film transistor substrate and the electronic device provided by the embodiments of the present application are described in detail above. In this paper, specific embodiments are used to illustrate a principle and an implementation mode of the present application. The description of the above-mentioned embodiments is only used to help understand a method and a core idea of the present application. At the same time, for those skilled in the art, according to the idea of the present application, there will be changes in specific implementation modes and scopes of application. In conclusion, contents of the specification should not be interpreted as a limitation of the present application.

What is claimed is:

1. A thin film transistor substrate comprising:
a substrate;
a boss located on the substrate, wherein the boss comprises an undercut structure, the undercut structure is located on a side wall of the boss;
a filler located in the undercut structure; and
an active layer located on the boss and the substrate, wherein the active layer comprises a channel, the channel covers the undercut structure and the filler;
wherein the boss comprises a first film layer and a second film layer, and the first film layer and the second film layer are stacked on the substrate in sequence; and at a junction of the first film layer and the second film layer, the first film layer is partially indented inward to define the undercut structure.

2. The thin film transistor substrate of claim 1, wherein the undercut structure is located on a side of the boss close to the substrate.

3. The thin film transistor substrate of claim 1, wherein the channel is a single-crystal structure, a length of the channel is greater than or equal to 0.01 μm and less than or equal to 1 μm, and a thickness of the boss is greater than or equal to 800 Å and less than or equal to 3000 Å.

4. The thin film transistor substrate of claim 1, wherein the undercut structure is defined by a bottom surface of the second film layer and a side wall of the first film layer, and the bottom surface is a surface of the second film layer contacting the first film layer.

5. The thin film transistor substrate of claim 4, wherein a distance between an edge of the bottom surface and the side wall of the first film layer is greater than or equal to 0.3 μm and less than or equal to 1 μm.

6. The thin film transistor substrate of claim 1, wherein an included angle between a top surface of the second film layer and a side wall of the second film layer is greater than 90°.

7. The thin film transistor substrate of claim 1, wherein the channel covers at least a part of a side wall of the second film layer.

8. The thin film transistor substrate of claim 1, wherein a ratio of a thickness of the second film layer to a thickness of the first film layer is greater than or equal to 2 and less than or equal to 5; the first film layer is a silicon nitride layer, and the second film layer is a silicon oxide layer.

9. The thin film transistor substrate of claim 1, wherein the thin film transistor substrate further comprises a gate insulating layer, a gate electrode, an interlayer insulating layer, and a source-drain layer stacked on the active layer in sequence, and an orthographic projection of the gate electrode on the substrate covers an orthographic projection of the channel on the substrate.

10. The thin film transistor substrate of claim 9, wherein the gate insulating layer comprises an inclined part, the inclined part covers a part of the active layer located on the side wall;
the gate electrode comprises a gate sidewall located on the inclined part, and a slope angle of the gate sidewall on the inclined part is greater than or equal to 30° and less than or equal to 60°.

11. The thin film transistor substrate of claim 9, wherein the active layer further comprises a first doped area and a second doped area located on two opposite sides of the channel and connected to the channel, the source-drain layer comprises a source electrode and a drain electrode, and the source electrode and drain electrode are connected to the first doped area and the second doped area through vias respectively;
wherein the first doped area is located on a top part of the second film layer, and the second doped area is located on the substrate and disposed on a same layer with the first film layer.

12. The thin film transistor substrate of claim 9, wherein the channel comprises a first channel and a second channel, the undercut structure comprises a first undercut structure and a second undercut structure located on two sides of the boss, the first channel covers the first undercut structure, and the second channel covers the second undercut structure;
the active layer further comprises a first doped area located between the first channel and the second channel and disposed on a top part of the boss, a second doped area disposed opposite to the first doped area on another side of the first channel and located on the substrate, and a third doped area disposed opposite to the first doped area on another side of the second channel and located on the substrate; the source-drain layer comprises a first source electrode, a second source electrode, and a drain electrode, the drain electrode is connected to the first doped area through a via, the first source electrode is connected to the second doped area through a via, the second source electrode is connected to the third doped area through a via, and the first source electrode and the second source electrode are electrically connected to each other.

13. The thin film transistor substrate of claim 9, wherein the channel comprises a first channel and a second channel, the undercut structure comprises a first undercut structure and a second undercut structure located on two sides of the boss, the first channel covers the first undercut structure, and the second channel covers the second undercut structure;
the active layer further comprises a first doped area located between the first channel and the second channel and disposed on a top part of the boss, a second doped area disposed opposite to the first doped area on another side of the first channel and located on the substrate, and a third doped area disposed opposite to the first doped area on another side of the second channel and located on the substrate; the source-drain layer comprises a source electrode and a drain electrode, the source electrode is connected to the second doped area through a via, and the drain electrode is connected to the third doped area through a via.

14. The thin film transistor substrate of claim 1, wherein a ratio of a thickness of the boss to a thickness of the active layer is greater than or equal to 2 and less than or equal to 7.

15. The thin film transistor substrate of claim 1, wherein the undercut structure is defined by a part of a bottom surface of the second film layer and a part of a side wall of the first film layer, and is located at a junction of the first film layer and the second film layer, and the part of the side wall of the first film layer is recessed toward inside of the first film layer to define the undercut structure.

16. A thin film transistor substrate comprising:
a substrate;
a boss located on the substrate, wherein the boss comprises an undercut structure, the undercut structure is located on a side wall of the boss and on a side of the boss close to the substrate;
a filler located in the undercut structure; and
an active layer located on the boss and the substrate, wherein the active layer comprises a channel, the channel is a single-crystal structure, and the channel covers the undercut structure and the filler;
wherein the substrate comprises a buffer layer, and a top surface of the boss and a side wall of the buffer layer are recessed toward inside of the boss to define the undercut structure.

17. An electronic device, wherein the electronic device comprises a thin film transistor substrate, and the thin film transistor substrate comprises:
a substrate;
a boss located on the substrate, wherein the boss comprises an undercut structure, the undercut structure is located on a side wall of the boss;
a filler located in the undercut structure; and an active layer located on the boss and the substrate, wherein the active layer comprises a channel, the channel covers the undercut structure and the filler;

wherein the substrate comprises a buffer layer, the boss comprises a first film layer and a second film layer, the first film layer is located between the second film layer and the buffer layer, the undercut structure is defined by a bottom surface of the second film layer and a side wall of the first film layer, and the bottom surface is a surface of the second film layer contacting the first film layer;

a ratio of a thickness of the second film layer to a thickness of the first film layer is greater than or equal to 2 and less than or equal to 5.

* * * * *